United States Patent [19]

Langdon, Jr. et al.

[11] 4,122,440

[45] Oct. 24, 1978

[54] METHOD AND MEANS FOR ARITHMETIC STRING CODING

[75] Inventors: Glenn George Langdon, Jr.; Jorma Johannen Rissanen, both of San Jose, Calif.

[73] Assignee: International Business Machines Corporation, Armonk, N.Y.

[21] Appl. No.: 774,365

[22] Filed: Mar. 4, 1977

[51] Int. Cl.² ............................................. H03K 13/24
[52] U.S. Cl. ............................................. 340/347 DD
[58] Field of Search .................. 340/347 DD; 235/310

[56] References Cited

PUBLICATIONS

Pasco, "Source Coding Algorithms for Fast Data Compression" Doctoral Dissertation Stanford University, © 1976.
Rissanen, "IBM J. Res. Develop", vol. 20, No.3, pp 198–203, May 1976.

*Primary Examiner*—Charles D. Miller
*Attorney, Agent, or Firm*—Robert Bruce Brodie

[57] ABSTRACT

There is disclosed a method and means for compacting (encoding) and decompacting (decoding) binary bit strings which avoids the blocking of string elements required by Huffman coding and the ever increasing memory as is the case in simple enumerative coding. The method and means arithmetically encodes successive terms or symbols in a symbol string $s = a_i a_j \ldots$, in which each new term $a_k$ in a source alphabet of N symbols gives rise to a new encoded string $C(sa_k)$ and a new length indicator $L(sa_k)$. The method and means comprises the steps of forming $L(sa_k)$ from the recursion $L(sa_k) = L(s) + l(a_k)$, where $l(a_k)$ is a rational approximation of $\log_2 1/p(a_k)$, $p(a_k)$ being the a'priori probability of occurrence of $a_k$, and $l(a_k)$ being so constrained that the Kraft inequality is satisfied:

$$\sum_{k=1}^{N} 2^{-l(a_k)} \leq 1;$$

and forming $C(sa_k)$ from the recursion $C(s) + [P_{k-1} 2^{L(sa_k)}]$, where:

$$P_{k-1} = \sum_{i=1}^{k-1} p(a_i),$$

and where $P_{k-1}$ is the cumulative probability of occurrence of an arbitrary ordering of all symbols.

Instead of assigning a'priori code words to each symbol as in Huffman coding, the method and means ascertains the new encoded string $C(sa_k)$ from the ordinal number (position number $k$) of the symbol $a_k$, in the arbitrary ordering, the value of the fractional part of $L(sa_k)$, and the last few bits of the previous compressed symbol string $C(s)$. This results in the generation of two quantities i.e. the encoded string of compressed characters and the fractional length indicators. The use of only a few bits of the last encoded string $C(s)$ for determining $C(sa_k)$ limits the requisite memory to a constant value. During each encoding cycle, the least significant number of bits of $C(s)$ are shifted out as determined by the integrer part of $L(sa_k)$.

13 Claims, 7 Drawing Figures

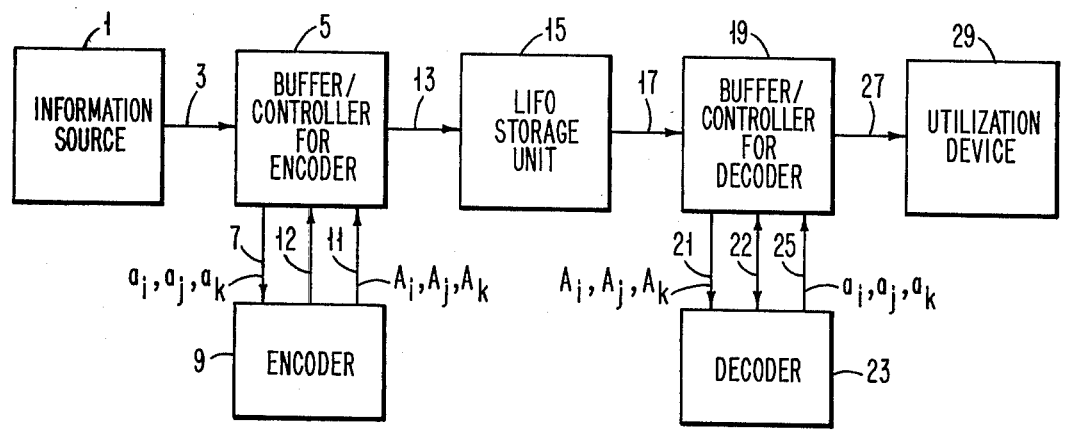
FIG. 1A
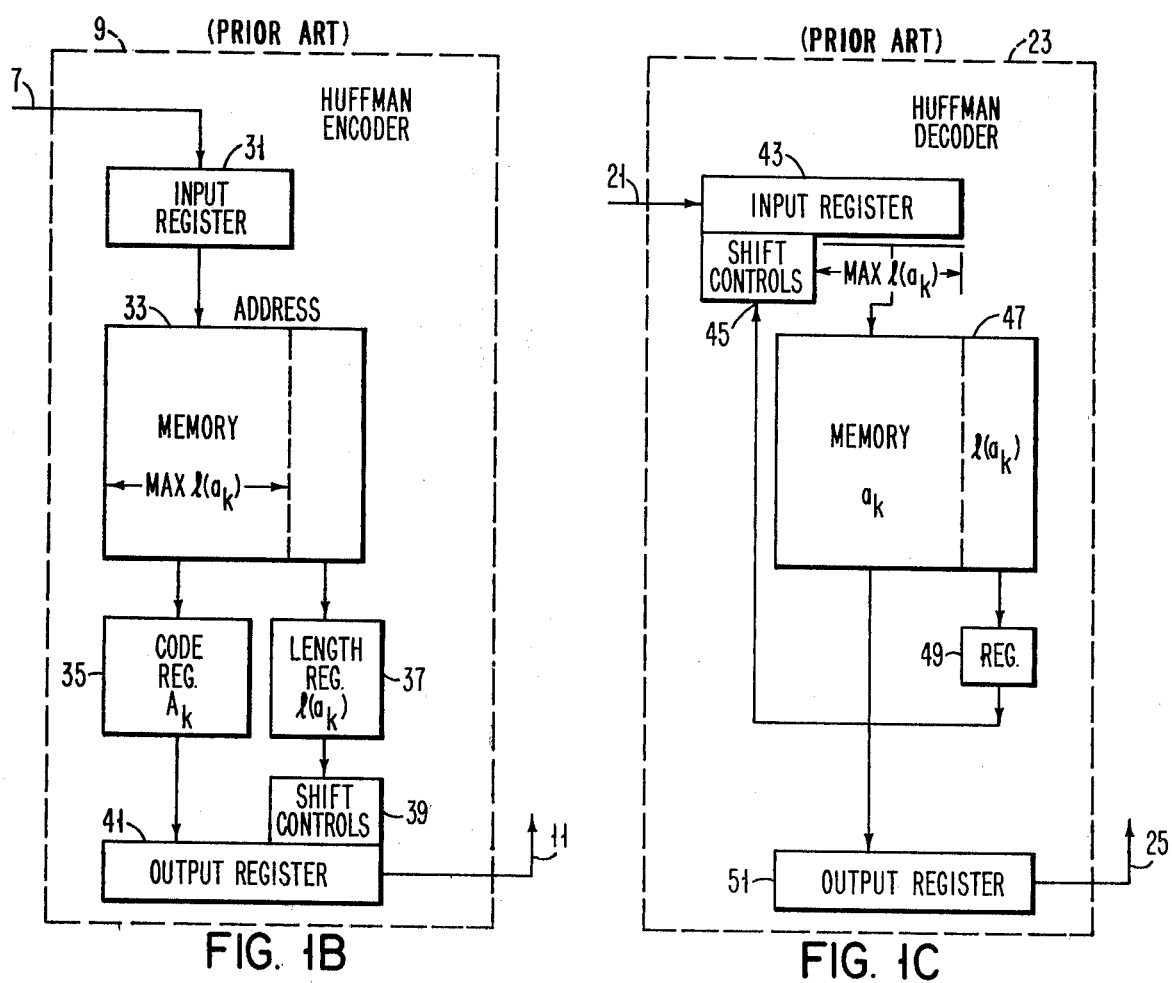
FIG. 1B (PRIOR ART)
FIG. 1C (PRIOR ART)

TIMING CHART FOR ENCODER SHOWING WORST-CASE DELAYS

TIMING CHART FOR DECODER SHOWING WORST-CASE DELAYS

METHOD AND MEANS FOR ARITHMETIC STRING CODING

BACKGROUND OF THE INVENTION

The invention relates to the encoding and decoding of strings of symbols from finite source alphabets, which encoding takes advantage of the relative frequency of occurrence of the symbols in order to achieve *compaction*. More particularly, the invention relates to an improvement over both the *enumerative encoding* technique and the Huffman compaction technique. As may be recalled, Huffman taught a method for compaction by assigning a variable length code word to each character in the source alphabet, in which the length of the code word was *inversely* related to the relative frequency of occurrence of the character. The statistics of occurrence were either stationary or semi-stationary. That is, the method did not contemplate a constant adaptive reordering and reassignment of code words.

Since Huffman's original paper in September 1952, *Proceedings of the IRE*, pages 1098–1101, "A Method for the Construction of Minimum Redundancy Codes," modifications have been made as represented by a series of U.S. patents; namely, U.S. Pat. Nos. 3,675,211; 3,675,212; 3,701,111; 3,694,813; 3,717,851; and T925,002. A useful source of background information is the book by Norman Abramson, "Information Theory and Coding," McGraw Hill, 1963, chapters 3 and 4. It remains, nevertheless, a *classical code* possessing certain attributes. These attributes include words formed from a *fixed sequence of a' priori symbols;* all of the words being distinct (nonsingularity), and no word of the code being a prefix of another code word (unique decodability).

Enumerative coding is the encoding of, say, each permutation of binary string of n symbols by first ordering the $2^n$ terms and representing the term by an *ordinal number*. Reference may be made to T. M. Cover, "Enumerative Source Encoding," *IEEE Transactions on Information Theory*, January 1973, pages 73–77. More specifically, given a binary string of $n$ binary digits, $m$ of which are 1's, then let $T(n,m)$ denote the set of all strings of $n$ binary digits having $m$ ones. It is necessary to "order" (arrange) the terms in a consistent manner, i.e., by size (lexicographically) with predetermined priority (left-to-right). As an example, if $n=3$ and $m=2$, then $011<101<110$ would be an ordering. If one assigns a position number to each term in the ordering, then the last term is the binomial coefficient $$\binom{n}{m} = n!/(n-m)!m!.$$

All other position numbers (code words) are smaller.

In both Huffman and enumerative coding, the attainable average per symbol length has a lower bound determined by the appropriate entropy function for source symbol frequencies.

Given a source symbol string $s$ where $s = a_i a_j \ldots$ grows to the right; let $sa_k$ denote the new string obtained by appending the new symbol $a_k$ where $k$ runs from 1 to N, to the end of old string $s$. In the Huffman codings, the encoded representation of $sa_k$ is obtained by appending or concatenating the codeword $A_k$ of the symbol $a_k$ to the right end of the code of $s$. This means that the code word length would grow with a whole number of bits for each symbol independent of the symbol frequencies. This further means for binary source strings, Huffman coding produces either no compaction or for small alphabets may produce insufficient compaction.

In order to obtain improved Huffman compaction, then, for small source alphabets; a technique known as *blocking* has been employed. In blocking, the new source symbols of the new source alphabet are the juxtaposition of two or more of the original source symbols. Taking $k$ symbols at a time increases the source alphabet size to $N^k$.

As is apparent, enumerative coding does *not* require blocking. However, the calculation of each new code word $C(sa_k)$ requires information of all of the bits of the old string $C(s)$. This, in turn, requires an *indefinitely growing memory*.

SUMMARY

It is an object of this invention to devise a method and means for compaction and decompaction of code strings, especially binary bit strings. Related, the method and means should avoid both the blocking requirement of the Huffman technique and the infinite (ever increasing) memory necessary to support simple enumerative coding.

It is yet another object that the method and means constitute a unitary string coding technique, which technique is substantially invariant to arbitrary orderings of the symbols, as well as being invariant to source alphabet size. These objects should hold so long as the relative frequency of occurrence of the source symbols are either known or capable of being estimated.

It is still another object that the method and means exhibit a specifiable compaction ratio approaching the entropy bound in the limit, see Abramson pages 65–74.

Given a string $s = a_i a_j \ldots$ of symbols, then Huffman would assign an a'priori code word to each unique symbol in the finite source alphabet from which the symbols were drawn. In enumerative coding, the string $s$ would be represented by a coded string $C(s)$ such that in response to the next symbol $a_k$, the new code string $C(sa_k)$ would require taking into account all of the $C(s)$ string.

It was unexpectedly observed that the new string $C(sa_k)$ could be formulated from the ordinal or position number $k$ of $a_k$ of an arbitrary ordering of all the symbols in the source alphabet, the fractional as well as integer values of a length attribute, and the last few digits of the prior code string $C(s)$. These observations are embodied in a method and means which requires first, the determination of the length attribute and second, unique utilization of the fractional and integer parts thereof in generation of the new codestring. In the coding procedure, the length attribute $L(sa_k)$ for the new code string is first determined. After this the new code string is calculated. This is succinctly expressed in the following recursions:

$$L(sa_k) = L(s) + l(a_k)$$

$$C(sa_k) = C(s) + P_{k-1} 2^{L(sa_k)}$$

where $L(s)$ is the length attribute for code string $C(s)$, $l(a_k)$ is the rational number approximation for log $(1/p(a_k))$, $p(a_k)$ being the a'priori probability of occurrence. The length indicator $l(a_k)$ must further satisfy the Kraft inequality $$\sum_{k=1}^{N} 2^{-l(a_k)} \leq 1$$

for an N symbol alphabet.

$P_{k-1}$ is the cumulative probability of occurrence of an arbitrary ordering of the symbols in the alphabet such that $$P_{k-1} = \sum_{i=1}^{k-1} p(a_i), \text{ where } P_o = 0, P_N = 1$$

Where $P_o=0$, $P_n=1$.

It is also considered as a part of this invention that fractional as well as the integer parts of the length attribute can be advantageously utilized. For example, $$L(sa_k) = [L(s) + l(a_k)] = \text{integer } y + \text{fraction } x = y(sa_k) + x(sa_k)$$

This is applied to the second recursion with the following result:

$$C(sa_k) = C(s) + P_{k-1} 2^{-L(sa_k)} = C(s) + P_{k-1}[2^{-y(sa_k)} \cdot 2^{-x(sa_k)}]$$

Since $y$ is an integer, then multiplication of a term in a register by $2^{\pm y}$ constitutes a left shift for $+y$ and a right shift for $-y$. The factor $2^x$ can be approximated by $q$ bits i.e. $e(x) \approx 2^x$. This lends itself to table look up.

As a result of these considerations, one embodiment of the apparatus of the invention for encoding purposes provides for generating a new encoded string by:

(1) table look up for $l(a_k)$
(2) addition to obtain $L(sa_k)$
(3) table look for $e(x) \approx 2^x$
(4) multiplication of $P_{k-1}$ and $e(x)$
(5) left shift by $y$ bits
(6) the addition of $C(s)$ and $P_{k-1}e(x)2^Y$.

Another embodiment combines steps (3) and (4) and shifts right in step (5). This results from rewriting the recursion:

$$2^{-y(sa_k)}C(sa_k) = 2^{-y(sa_k)}C(s) + A_k$$

where $A_k = P_{k-1}2^{x(sa_k)}$. The revised procedure is:

(1) table look up for $l(a_k)$
(2) addition to $x(s)$ to obtain $L(sa_k) = y(sa_k) + x(sa_k)$
(3) table look up for $A_k$
(4) right shift of $C(s)$ by $y(sa_k)$ bit positions
(5) addition of $A_k$ and $2^{-y(sa_k)} \cdot C(s)$ This alternative simplifies calculation of the new code string. It requires only the addition of $A_k$ to the old shifted code string. This is based upon the fact that $A_k$ is merely a function of the position number $k$ and the fraction $x(sa_k)$. More significantly, the alternative takes advantage that $A_k$ and $C(s)$ retain the same relative positions with respect to the binary point. In this context, it should be recalled that $P_{k-1}$ and $x(sa_k)$ lie in the range between 0 and 1.

In so far as the encoding is concerned, a source symbol string is serially applied to the apparatus and an encoded binary string is generated therefrom. The encoded binary string can only be decoded by taking into account the starting points and end point of the string. If $C(sa_k)$ is restricted to having a magnitude between 0 and 2, then the binary point of $C(sa_k)$ can be aligned with the last augend $A_k$. Consequently, the left most (leading) bit of $C(sa_k)$ represents an integer and the bits to the right thereof are fractional.

Of some interest is the fact that the string within the encoder consists of "r" digits. "r" digits is also the index of precision for $A_k$. For every $y$ of the least significant digits of $C(s)$ that are shifted out of the encoder during a cycle, $y$ digits of the most significant digits are appended to the string in the new calculation. The parameter "r" preferably should be set $\geq \log(1/p_m)$, $P_m$ is the probability of occurrence of the rarest symbol.

Decoding requires the use of a length attribute in order to "parse" the compressed bit string into decodable characters and then "detach" the characters from the string in a dual manner to encoding. More particularly, if the decoder contains a memory of $2^{r+q}$ words where $r$ is the length in bits of $A_k$, then decoding requires:

(1) locating the beginning of the encoded string $C(sa_k)$,
(2) addressing the memory with the next $r$ bits of $C(sa_k)$ and $q$ bits of the retained fraction $x(sa_k)$ and retrieving $a_k$ and $l(a_k)$.
(3) shifting the string by $y(sa_k)$ bits to align the decoder with the next portion of the compressed code string.

The invention represents a compaction method which, in addition to avoidance of blocking and requiring only a finite memory, also permits the control of error and memory size for code word tables.

For example, $n$-bit blocking is needed in the Huffman coding of binary alphabets in order to guarantee the existence of the upper bound in $H(s) \leq L_n/n < H(s) + 1/n$ (see Norman Abramson or Shannon's First Theorem, p. 73) where $H(s)$ is the entropy, or theoretical minimum average length per encoded symbol, and $Ln/n$ is the average length per encoded symbol by the coding method. The size of the tables for the Huffman code words will need a table of $2^n$ code words, with many code words having more than $n$ bits.

In contrast, for the same upper bound of $[H(s) + (1/n)]$ arithmetic coding can use tables whose size is on the order of $n$; where each word length is on the order of $\log_2 n$.

In addition to compaction of coded characters, arithmetic coding also provides an alternate compression technique to strings of non-coded (raster coded data) than the present sparse matrix techniques. The key here is the expectation that a *single compaction method* exists for binary string encoding, rather than distinct mechanisms for coded and non-coded source data.

BRIEF DESCRIPTION OF THE DRAWING

FIG. 1A depicts binary string coding apparatus used conjunctively with a combination storage and transmission system.

FIGS. 1B and 1C represent functional block diagrams of prior art Huffman encoders and decoders.

DESCRIPTION OF THE PREFERRED EMBODIMENT

Figure 2:
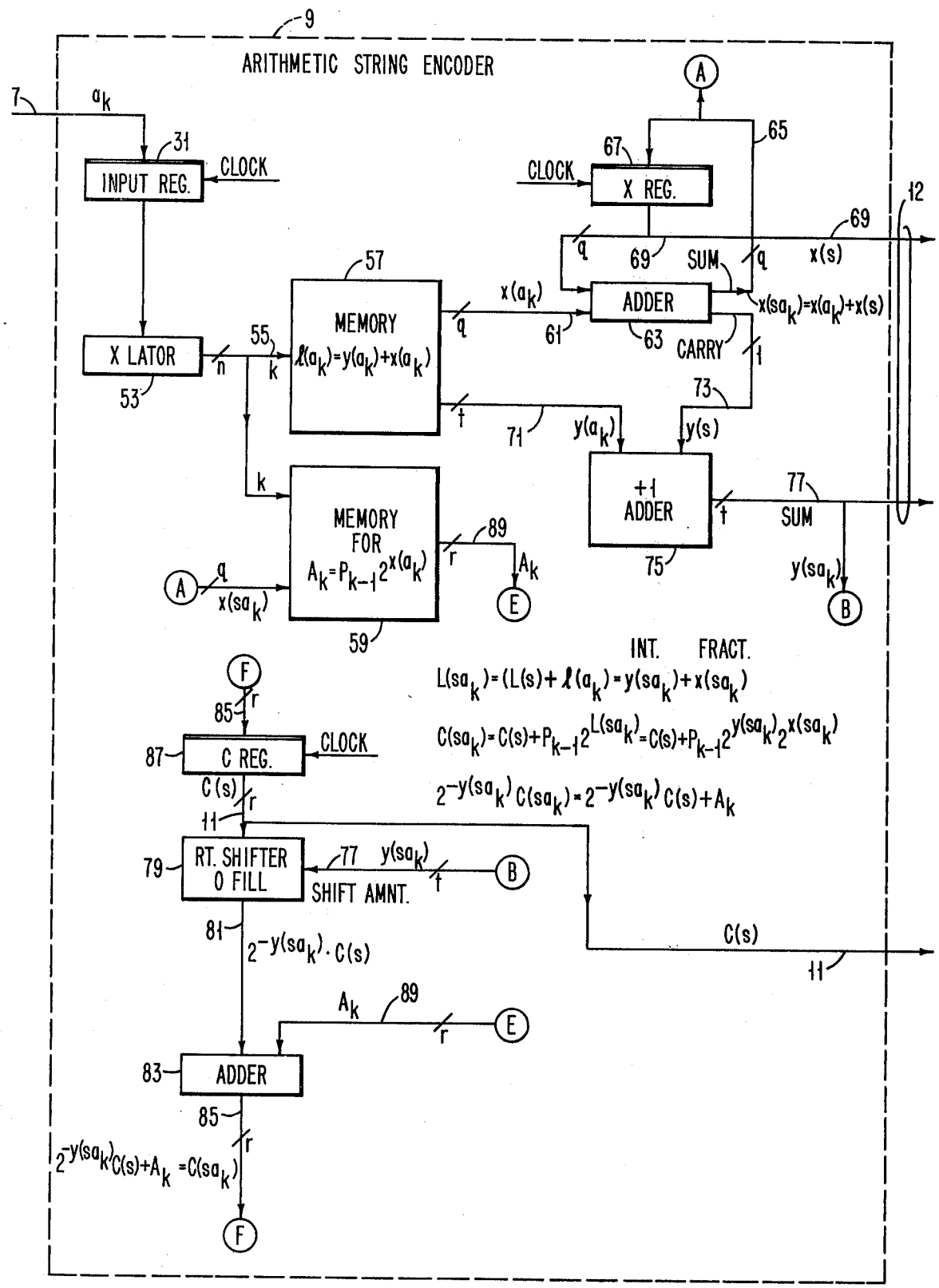
FIGS. 2 and 3 show functional logic diagrams of respectively arithmetic string encoders and decoders according to the invention.

Referring now to FIG. 1, there is shown a generalized binary string coding apparatus used conjunctively with a combination storage and transmission system. In this regard, an information source 1 applies a sequence of source symbols $a_k$ selected from a source alphabet:

$$\{a_1, a_2 \ldots, a_k \ldots, a_N\}.$$

The symbols are serially applied to path 3 where they are accumulated by buffer/controller 5. Buffer 5 provides the necessary speed matching between the information source and any necessary signal conditioning or code transformation required prior to subsequent transmission. A typical storage and transmission system would include a last in/first out LIFO storage unit 15 driving a utilization device 29. Since speed matching and code transformation is a usual concommitant of utilization devices, then another buffer/controller 19 is connected to the storage unit and the device over paths 17 and 27. Typically, a sequence of symbols from source 1 is accumulated by buffer 5 over path 3. The symbols are then applied to a transformation device such as an encoder 9 over requisite path 7. The encoder executes a 1 to 1 mapping and delivers the transformed symbols to buffer 5 over path 11. Control information relating to clocking and the length attribute of each code character is transmitted over a separate parallel path 12. Likewise, the transformation of characters received from storage unit 15 as accumulated by buffer 19, is performed by decoder 23. The decoder must recover the original symbols generated by source 1. As such, it must extract both the original characters and length attribute information in order to properly parse the binary string presented to it on path 21 from buffer 19. Both the length attribute and source character data is transmitted from said buffer over paths 22 and 25 respectively.

Huffman Encoding/Decoding

Referring now to FIGS. 1B and 1C, there are depicted functional block diagrams of prior art Huffman encoders and decoders. It is desirable to spend a word or two on some of the properties of Huffman codes. A Huffman code takes advantage of the a'priori probabilities of occurrence $p(a_k)$ where $(k=1,2, \ldots N)$ of each source symbol by assigning a corresponding code word of variable length $l(a_k)$ where $p(a_k) \geq 2^{-la_k}$ and $$\sum_{i=1}^{N} 2^{-l(a_k)} \leq 1.$$

Where the encoded string consists of 0's and 1's, then $l(a_k)$ corresponds to the number of bits in the Huffman code word for $a_k$.

The Huffman encoding of the source string comprises the steps of retrieving from a memory a code word $A_k$ and length $l(a_k)$ responsive to each source symbol $a_k$, and shifting the previously encoded string C, $l(a_k)$ bits to the right or left, and appending the code word $A_k$. The Huffman encoding of the source string $a_i a_j a_k$ is then represented by $A_i A_j A_k$. This is referred to as the concatenation of the corresponding code words.

Referring now to FIG. 1B, accumulated source symbols $a_i, a_j, a_k$ are serially sent from buffer 5 to encoder 9 over path 7 where they are lodged in input register 31. The contents of memory address $a_k$ consists of Huffman code word $A_k$ and length attribute $l(a_k)$. These elements are read into corresponding registers 35 and 37.

$A_k$ is in turn transferred from register 35 to a predetermined position in output shift register 41. The length attribute $l(a_k)$ located in register 37 operates shift control 39 which moves code word $A_k$ a predetermined number of positions so as to allow the entry of the next character into the output register and placement upon transmission path 11.

Referring now to FIG. 1C, there is shown a Huffman decoder 23. This decoder is representative of the type shown in Frank U.S. Pat. No. 3,883,847 issued on May 13, 1975 entitled "Uniform Decoding of Minimum Redundancy Codes." The compressed code word string from buffer controller 19 is applied to input register 43 over path 21. The maximum code word length is known a'priori. Thus, for a memory size $\log_2(1/p_m)$ words, where $\log_2(1/p_m)$ is the length (the number of bits) of the longest unit code word, then the first $\log_2(1/p_m)$ bits are transferred into register 43 for the purpose of addressing memory 47. The values retrieved from memory 47 are source symbol $a_k$ and its length $l(a_k)$ is entered into register 49. The contents of register 49 are used to shift register 43 through controls 45 so as to align the new beginning point for the next code word decoding.

Fractional Code Word Lengths Improve Compression Efficiency

It is evident that the lengths of Huffman type compression code words are restricted to integer values. It is asserted as a general truth of coding that in order to be decoded, each code word of variable length $l(a_k)$ is related to its relative frequency of occurrence $p_k$ in its source alphabet by:

$$p(a_k) \geq 2^{-l(a_k)}; p(a_k) = 2^{-l(a_k)} + E; \therefore l(a_k) = \log_2[1/p(a_k)] + E^1$$

It is apparent that if $l(a_k)$ consists of integers, then $p(a_k)$ is nonrational. It follows that a compression coding system of integer valued code word lengths cannot have superior compression efficiency as a system in which code word lengths are inclusive of fractional values. This inclusion of fractional values in the case with enumerative and arithmetic string codes.

The Encoding Algorithm According to One Embodiment of the Invention

Given a sequence $s$ of source symbols $a_i, a_j$ each new symbol $a_k$ may be viewed as being appended to sequence $s$ i.e. $s = a_i a_j$; $sa_k = a_i a_j a_k$. If $s$ is applied to an encoder, its output is designated $C(s)$. In both enumerative and string encoding, $$s \rightarrow C(s)$$

$$sa_k \rightarrow C(sa_k)$$

The encoding is defined recursively as follows:

$L(sa_k) = $ length attribute $= L(s) + l(a_k)$ $C(sa_k) = $ compressed code string $= C(s) + P_{k-1} 2^{L(sa_k)}$ $$l(a_k) = \log_2 1/p(a_k); P_{k-1} = \sum_{i=1}^{k-1} p(a_i); P_o = 0; P_N = 1$$

and where $p(a_k)$ and $l(a_k)$ are constrained such that $$\sum_{k=1}^{N} 2^{-l(a_k)} \leq 1.$$

If the length attribute is factored into the sum of its integer and fractional components, it is then possible to more easily facilitate the computation of the compressed encoded string $C(sa_k)$. Thus:

$$L(sa_k) = y(sa_k) + x(sa_k)$$

integer   fraction $$C(sa_k) = C(s) + P_{k-1} 2^{y(sa_k)} \cdot 2^{x(sa_k)}$$

Let $$A_k = P_{k-1} 2^{x(sa_k)}$$

Then $$C(sa_k) = C(s) + A_k 2^{y(sa_k)}$$

Alternatively, $$2^{-Y}C(sa_k) = 2^{-Y}C(s) + A_k$$

$0 \leq P_{k-1} < 1$ and $0 \leq x(sa_k) \leq 1$.

Since $A_k$ is a function of $k$ and $x$, the value can be determined by table look up on $k$ and $x$. However, the generation of the encoded string $C(sa_k)$ requires the careful alignment of the old encoded string $C(s)$ with the table derived value $A_k$. Restated, it is important that the relative alignment between the old code string and the derived value be maintained.

Referring now to FIG. 2, there is shown the arithmetic 30 string encoder illustrating the alternate form of the recursion. The encoder is responsive to a source symbol $a_k$ on path 7 for generating a compressed encoded string $C(sa_k)$ on path 11, together with control information on path 12 consisting of the retained fraction on line 69 and the shift amount on line 77.

Timing Scheme

Figure 4A:
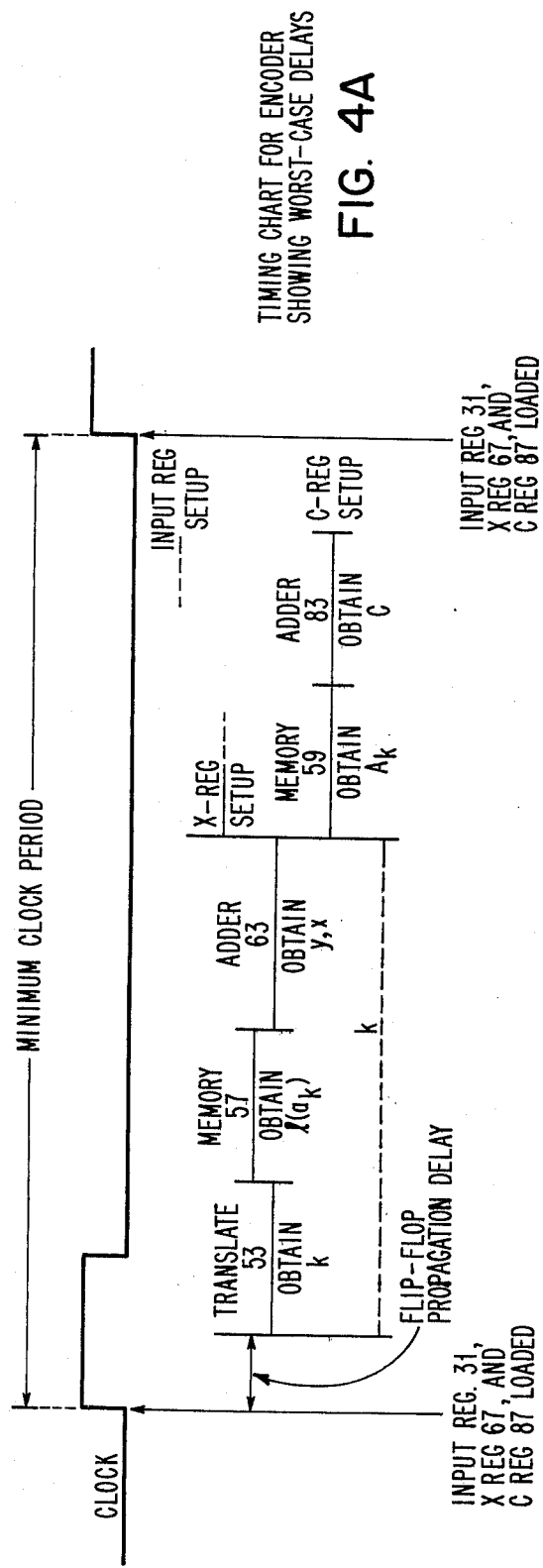
FIGS. 4A and B is a sequencing and timing chart for the encoder and decoder of FIGS. 2 and 3.
Figure 4B:
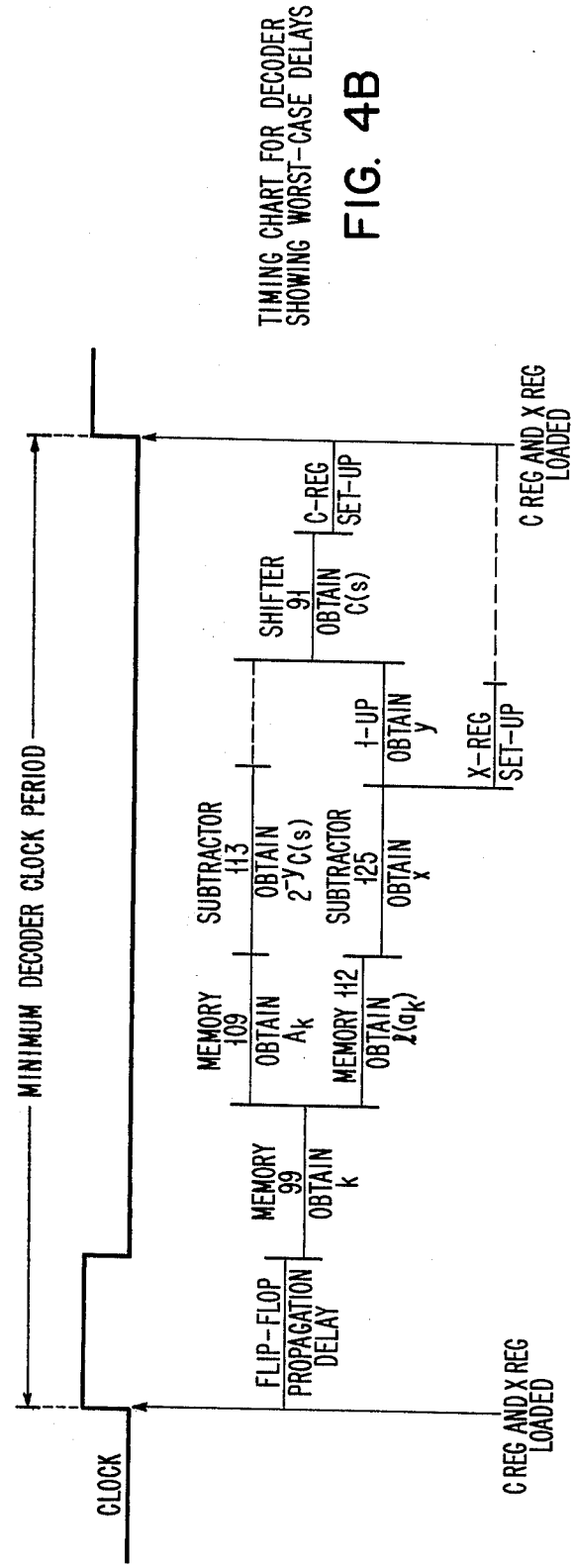

The timing schemes for the encoder and decoder are straightforward, of the synchronous single-phase category, with sufficient time between clock pulses to allow for the worst case combinational circuit delays, flip-flop set-up times and propagation delays. See the book by J. B. Peatman, *The Design of Digital Systems*, McGraw-Hill, 1972, pp. 161–170. In this regard, FIG. 4A shows the relative location of these delays for the encoder, and FIG. 4B shows them for the decoder. Clock skew is presumed to be within the maximum allowable tolerance (Peatman, p. 167–170).

Encoder memories 57 and 59, as with decoder memories 99, 109 and 117 (FIG. 3), are loaded with the requisite values during an initialization phase. The memories may be of the "read/write" type, the "read-only" type, or "programmable read-only memory". Means to load the memories are not described, these techniques pertain to the known art i.e. Memory Design Handbook, Intel Corp., Santa Clara, Calif. 95051, copyright 1975. C register 87 is important to the development of the encoded string as it holds the hightest-order $r$ bits, or arithmetic operand portion, of the previously encoded string. X register 67 is important as it holds the $q$ bit retained fraction. These registers are usually initialized to "0," however, X register 67 may be initialized to any value. The initialized value for C register 87 is constrained to be equal to or less than the value (maxC$_x$), depending on $x$, such value (maxC$_x$) as defined in the section "Requirements for A$_k$ and $r$." It is noted that for enumerative coding, the arithmetic operand portion of the previously encoded string $C(s)$ is the entire length of the string $C(s)$. In the method herein disclosed, C register 87 holds the *retained string segment*, which are only those highest-order $r$ bits which may constitute an arithmetic operand of the previously encoded string $C(s)$.

All lower-order bits are subjected only to shifting. Prior to its arithmetic use, the C register 87 contents are subjected to a right shift by shift amount $y(sa_k)$. When this happens, the $y(sa_k)$ rightmost bits of the C Register 87 are called the *output string segment* for the step, and are delivered to the buffer/controller 5 (FIG. 1A) over path 11, with control signal *shift amount* $y(sa_k)$ being sent over its portion of path 12 (FIG. 1A) to indicate to buffer controller 5 the number of bits it is to accept.

Each symbol $a_k$ is received in input register 31 and applied to a translator 53. The translator converts the symbol to its position or order number equivalent $k$. This number is applied over path 55 to memory 57. Memory 57 contains the length $l(a_k)$ according to the relation:

$$l(a_k) = \log_2(1/p(a_k)) = \underbrace{y(a_k)}_{t \text{ bits}} + \underbrace{x(a_k)}_{q \text{ bits}}$$

The integer portion $y(a_k)$ comprises $t$ bits while the fraction portion $x(a_k)$ consists of $q$ bits. Parenthetically, each path having a crosshatch mark references a multiconductor parallel path. Thus, path 55 contains $n$ conductors while path 61 and 71 contain respectively $q$ and $t$ conductors.

Adder 63 and +1 adder 75 determine the integer value $y(sa_k)$. Adder 63 and the clocked output of X register 67 determine the fractional value $x(sa_k)$. The value $y(sa_k)$ is an integer. Its value corresponds to a number of digits to be shifted in aligning the previous encoded string $C(s)$ in right shifter 79 with the $A_k$ on path 89 so that both may be combined in adder 83, to obtain the highest order digits of $C(sa_k)$.

The retained fraction, or the fractional value $x(sa_k)$, at the start of the next clock cycle will be placed in the X register 67, just as the value $x(s)$ was placed in X register 67 at the start of the present cycle. The value $X(sa_k)$ together with $k$ accesses the augend value $A_k$ by table look up from memory 59. $A_k$, requiring $r$ bits, is applied over path 89 to adder 83. The new code string $C(sa_k)$ is determined by summing $A_k$ and the appropriately shifted value of $C(s)$ in adder 83 as previously mentioned. Significantly, the $y(sa_k)$ lowest order bits of the previous $r$ bit retained string segment of $C(s)$ are pathed to the buffer controller 5. At the next clock cycle, the new retained segment of code string $C(sa_k)$ passes to register 87 over path 85. Also, the time period between consecutive clock pulses is calculated in order to permit $x(sa_k)$ and $C(sa_k)$ to stabilize, as determined by the maximum delays inherent in the circuits involved. The registers are "D" type flip flops which are "edge triggered" as exemplified by the 74 TTL family, type SN74174, "The TTL Data Book for Design Engineers," Texas Instruments Inc., 1973, pages 363–368. In this regard, buffer controller 5 may be adapted to provide the encoder with a new symbol $a_k$ at each clock pulse as well as removing the $y$ least significant digits of the previous related string segment of $C(s)$ which was shifted out. Upon the encoding of the last symbol, the buffer controller 5 accepts the final contents of $C(sa_k)$ and receives the value of the final retained fraction $x(sa_k)$.

The Size of Parameters "r" and "q"

As previously mentioned $C(sa_k)$ represents the encoded string responsive to symbol $a_k$ being applied to encoder 9. $C(s)$ is the previously encoded string. Its length in bits consists of the summation of all of the previous length attributes $l(a_k)$'s of previously encoded characters. However, how many bits are retained inside the encoder of this string $C(s)$? The answer is a predetermined number "$r$" *of the highest order bits. Of these $r$ retained bits of $C(s)$, $y(sa_k)$ of the lowest order bits of $C(s)$ are shifted out when the new length attribute $L(sa_k)$ is determined. This leaves $r-y(sa_k)$ bits of $C(s)$ remaining for use as an arithmetic operand, right justified to the lowest order bits of $A_k$. Recalling:

$$L(sa_k)=L(s)+l(a_k)=Y(sa_k)+x(sa_k).$$

However, the only portion of $L(s)$ retained was the fractional part $x(s)$ i.e. $L(s)=X(s)$. The integer portion $y(s)$ was used in shifting strings in the encoding process. It follows that $L(sa_k)=x(s)+l(a_k)=$ integer $y(sa_k)+$ fraction $x(sa_k)$.

In the encoding operation, the value $A_k$ is obtained by table lookup from memory 59. The address for accessing the memory comprise $n$ bits of $k$ (position number for $a_k$) and $q$ bits of the retained fraction $X(sa_k)$. In this regard, the number $q$ is treated as an independent design parameter.

The $r$ bits of an extracted $A_k$ must be aligned correctly with the $[r-y(sa_k)]$ bits of $C(s)$. In order to accomplish this, $C(s)$ is right shifted $y(sa_k)$ bit positions. Consequently, the lowest order bits in both $A_k$ and shifted $C(s)$ will be correctly aligned. To understand this computation, it will be recalled that in the case where $A_k$ is left-shifted, $C(sa_k)=C(s)+A_k 2^{Y(sa_k)}$. If $C(s)$ is right shifted with respect to $A_k$, this is the same as multiplying both sides of the recursion by $2^{-y(sa_k)}$ i.e.

$$2^{-y(sa_k)}C(sa_k)=2^{-y(sa_k)}C(s)+A_k.$$

The number $r$ determines the precision required of $A_k$. One significant design factor is the probability $p_m$ of the least frequently occurring source symbol. Note, that $A=P2^x$. Given the possibility that for:

$$A_k=P_{k-1}2^{x(sa_k)}$$

and $$A_{k+1}=P_k 2^{x(s'a_{k+1})}$$

where $x(sa_k)=X(s'a_{k+1})$, then it is necessary to discriminate between the P's in order to discriminate between the A's. Thus, to ensure that $P_k>P_{k-1}$, then $r\geq \log(1/p_m)$. Other considerations affecting the value of "$r$" are implicit in the subsequent discussed examples.

The number $q$ of bits in the retained fraction $x(sa_k)$ is a measure of how close the actual code word length approximates the ideal. As can be appreciated, the ideal length is $\log_2(1/p(a_k))$. Because Huffman code word lengths are restricted to integer values, then it cannot approach the ideal. As $q$ increases, a closer approximation to the ideal can be obtained.

The Right Shift Versus Left Shift

Allowing a parenthesized superscript to denote a symbol's position in the source string, let $C^{(0)}=0$ be the initial value of the encoded string and $L^{(0)}=0$ be the initial value of the length. In order to encode the first symbol $a^{(1)}$ of a string, determine $L^{(1)}=l^{(1)}=y^{(1)}+x^{(1)}$, and $A_{a(1)}(x^{(1)})$. Instead of shifting $A_a(1)$ left $y^{(1)}$ bits and adding to $C^{(0)}$; *it is possible to shift* $C^{(0)}$ *right* $y^{(1)}$ bits and add it to $A_{a(1)}$: $C^{(1)}=A_a(1)+0.2^{y(1)}$.

In order to encode string $a^{(1)}a^{(2)}$, then; the new relative length indicator is $L^{(2)}=l^{(2)}+x^{(1)}$. In this step, the failure to shift the fractional bit amount $x^{(1)}$ is accounted for by adding it to $l^{(2)}$. Let: $y^{(2)}=y(a^{(1)}a^{(2)})$ denote the integral portion of $L^{(2)}$, and $X^{(2)}=x(a^{(1)}a^{(2)})$ denote the fractional portion of $L^{(2)}$. The new encoded string is as follows:

$$C^{(2)}=C^{(1)}\cdot 2^{-y(2)}+A_{a(2)}(X^{(2)})$$

To encode the $(i)$-th source symbol, given encoded string $C^{(i-1)}$ and *retained fraction* $X^{(i-1)}$, the recursions become:

$$L^{(i)}=l^{(i)}+X^{(i-1)}=Y^{(i)}+X^{(i)}$$

$$C^{(i)}=A_{a(i)}(X^{(i)})+2^{-y(i)}\cdot C^{(i-1)}$$

In terms of adding source symbol $a_k$ to source string $(s)$ which has already been encoded as $C(s)$ with retained fraction $X(s)$, the recursions are:

$$L(sa_k)=l(a_k)+X(s)=y(sa_k)+x(sa_k)$$

$$C(sa_k)=A_k+C(s)\cdot 2^{-y(sa_k)}$$

Requirements for $A_k$ and "$r$"

At this point, we pause to describe the key technique which enables decoding. Corresponding to each symbol $a_k$ is a length $l_k$, which influences the amount of shifting $C(s)$ during encoding. The other factor which influences the shift amount is the old retained fraction $x(s)$. The shift amount $y(sa_k)$, new retained fration $x(sa_k)$ and the augend $A_k$ satisfy the following important inequality, called the *arithmetic coding inequality*:

$$A_{k+1}>A_k+2^{-y(sa_k)}C(s)$$

In other words, the augend amounts $A_{k+1}$ and $A_k$ corresponding to "adjacent" symbols $a_k$ and $a_{k+1}$ must be suitably diferent in magnitude and the shift amount sufficiently large to make $2^{-y(sa_k)}\cdot C(s)$ sufficiently small such that the sum is less than $A_{k+1}$. If that relationship does not hold, arithmetic coding will not work. Consider the decoding process for $C(sa_k)$; we know $C(sa_k)$ is at least as large as $A_k$, since that was an augend. It is also known from the above inequality that $C(sa_k)$ is less than $A_{k+1}$. It is also the case that the operand portion of $C(sa_k)$ has only $r$ bits, and $x(sa_k)$ has $q$ bits. Therefore, only $2^{r+q}$ possible combinations of $C(sa_k)$ and $X(sa_k)$ exists. For each such combination, the symbol $a_k$ which gave rise to $C(sa_k)$ is predetermined, and its ordinal $k$ may be stored in the corresponding word a $2^{r+q}$ word memory.

Consider now the existence of a table of values $A_k$ which enables encoding and decoding. From the arithmetic coding inequality; it is seen that $$A_{k+1}-A_k>C(s)\cdot 2^{-y(sa_k)}$$

In practice, the values $A_k$ are approximations to $r$ bits. The precision of the augend values $A_k$ depends upon the largest value $C(s)$ can achieve. This in turn depends upon the value $X'$ of the previous retained fraction and the index $k'$ *of the previously encoded symbol. Letting $X$ denote the present value of the retained fraction and $X'$ denote the prior value,* $y(a_k)+X=l(a_k)+X'$ so that $y(sa_k)=+l(a_k)+X'-X$. From this relationship, it is seen that for a given value of $X$ and $k$, $X'=$fractional part of $(1+X$-fractional part of $l(a_k))$. Since $$A_n^{(x)} > A_{n-1}^{(x)} > \ldots A_1(x),$$

then for a given retained fraction value of $x$, Max $C_x > A_n(x)$, where max $C_x$ denotes the maximum value of $C(sa_k) = A_k(x) + 2^{-y(sa_k)} \cdot C(s)$ which can be generated (encoded) with a current retained fraction value of X. The decoding criteria is then; for each $k < N$, and possible fraction value of X:

$$A_{k+1}(x) - A_k(x) > \text{Max } C_x \cdot 2^{-l_k - x' + x}$$

The above equation places no direct constraints on $A_N(x)$. However if $A_N(x')$ is too large, then max $C_x$, becomes larger, forcing the differences $A_{k+1}^{(x)} - A_k^{(x)}$ to become larger which in turn forces $A_n(x)$ still larger. To contain this problem, upper bounds must be placed on max $C_x$ and $A_n(x)$, such that this does not happen:

if for all $$x \; [A_n(x) \cdot 2^{-x} + 2^{-l}n] \leq 1$$

i.e. if $$(A_n(x) + 2^{x-l}n) \leq 2^x)$$

then (max $C_x) \leq 2$.

When C is at a maximum and symbol $A_n$ is encoded:

$$(\text{max } C_x) = A_n(x) + \text{max } C_x \cdot 2^{-l_n - x' + x}$$

multiply each side by $2^{-x}$:

$$(\text{max } C_x) \cdot 2^{-x} = [A_n(x) \cdot 2^{-x} + (\text{Max } C_x \cdot 2^{-x'}) \cdot 2^{-l}n]$$

From the above equation, if for all $x$ (Max $C_x) = 2^x$, then $[A_n(x) \cdot 2^{-x} + 2^{-l}n] = 1$ and vice-versa. It can be shown by induction that if for all $x \; [A_n(x) \cdot 2^{-x} + 2^{-l}n]$, then (max $C_x) < 2^{-x}$. The construction of the values for $A_k(k)$ will be illustrated by an example.

The Decoding Algorithm According to One Embodiment of the Invention

Figure 3:
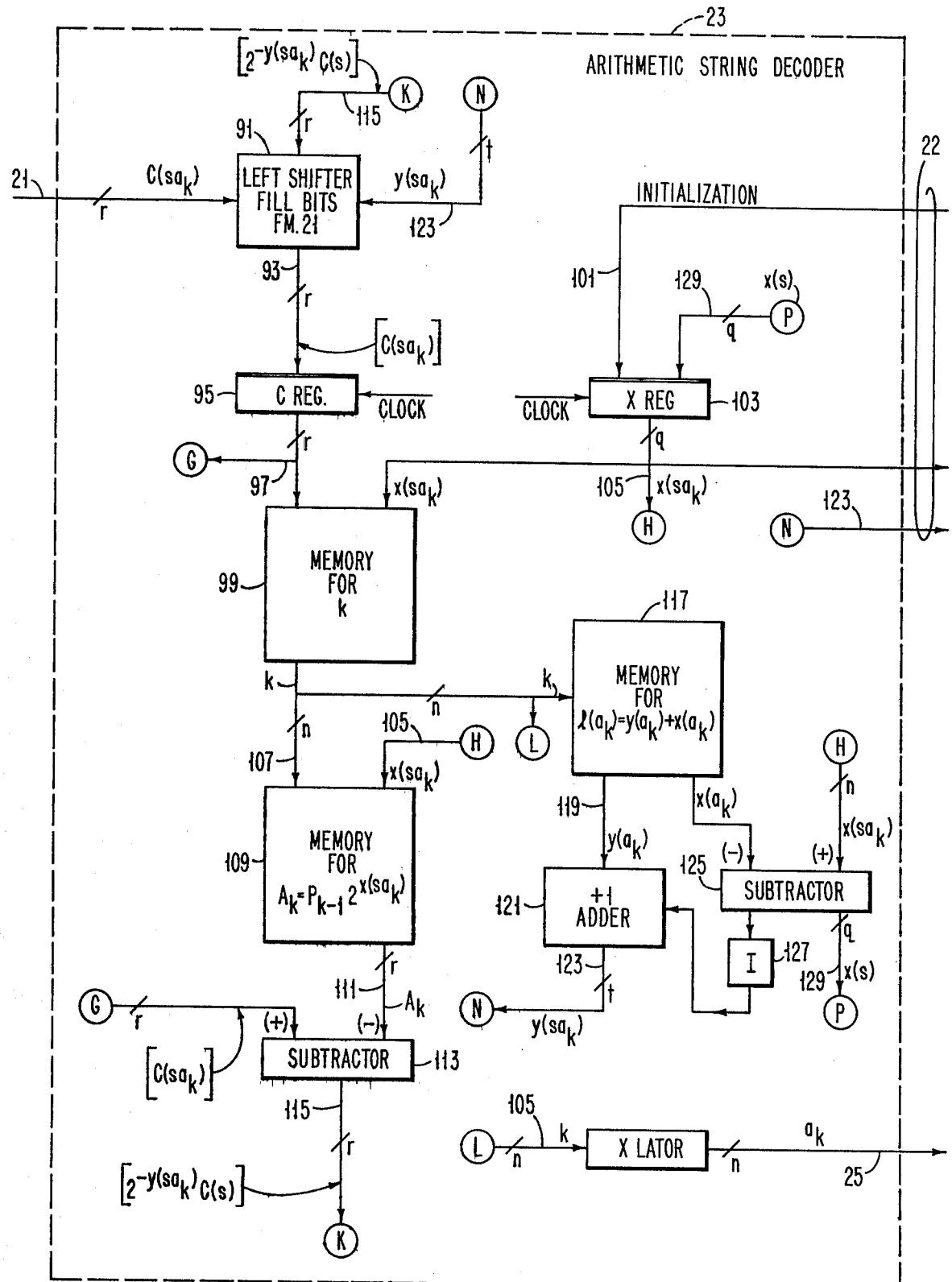

Referring now to FIG. 3, there is shown the arithmetic string decoder. The decoder interacts with buffer/controller 19 in that it receives a compressed string over path 21 and transmits to the buffer 19 the decoded symbols on path 25 together with length information necessary for shifting appropriate compressed bit string segments from the buffer to the decoder. The shifting control information is shifted over the portion of control paths 22 consisting of line 123.

In order to initialize the decoder, the value of the final retained fraction $x(sa_k)$ is placed by buffer/controller 19 in the X register 103, via line 101 of path 22. The higher order $r$ bits of $C(sa_k)$ are placed in register 95. The $r$ bits from register 95 together with the $q$ bits from retained fraction register 103 form an address for obtaining the position number $k$ of the ultimate symbol to be decoded $a_k$, this value being obtained from memory 99. In turn, the value for $A_k$ is obtained from memory 109 when accessed by the $n$ bits from $k$ and the $q$ bits from $x(sa_k)$ applied over respective paths 107 and 105.

It is clear that in order to extract the compressed encoded element, it is necessary to obtain and maintain the compressed encoded string without the new code word $C(s)$ in relative alignment with the string $C(sa_k)$ that includes the new symbol. This is accomplished in part by obtaining the relative magnitude difference between the encoded string obtained from path 97 and $A_k$ on path 111 as applied to subtractor 113. The shifted string $C(s)$ on path 115 is in turn applied to left shifter 91 to be restored to its alignment when encoded, with the buffer/controller supplying the "fill" bits to the shifter.

In order to obtain the integer and fractional components for the value $l(a_k)$, it is necessary to access a suitable memory 117 over path 107. As indicated in the figure, $y(a_k)$ is applied to adder 121 over path 119 and $X(a_k)$ is applied to the subtrahend input of subtractor 125. The fractional value $X(s)$ on path 129 is obtained from the difference between the fractional value $X(sa_k)$ applied to the minuend input on path 105 and $X(a_k)$. The integer value of the length attribute of the new code word, namely $y(sa_k)$ is obtained from the +1 addition in adder 121 between the complement of the borrow signal from subtractor 125 through inverter 127 added to $y(a_k)$.

At the decoding of the final symbol, register 95 should have the initial value of C (usually 0) and register 103 should have the initial value of the retained fraction. This can serve as a "check" on the storage and transmission of the encoded string.

The actual symbol value for $a_k$ is obtained when the value $k$ on path 105 is applied to translator 131. This operation is the inverse as applied to translator 53 in the encoder of FIG. 2. The output of translator 131 is sent over path 125 back to buffer 19.

The invention will become even more apparent when the embodiments and their clocking are described with reference to the following examples of encoding and decoding. The improvements are even further discernible when comparison is made with the Huffman encoding/decoding of the same source alphabet.

Example: Determination of augends $A_k$

The use of arithmetic coding is illustrated by means of an example. Consider a source alphabet $S = (a_1, a_2, a_3,$ and $a_4)$; where $p_1 = 0.65$, $p_2 = 0.075$, $p_3 = 0.025$ and $p_4 = 0.25$. For source S, the entropy is 1.31729 bits per symbol, and the lengths for the corresponding Huffman code are $l_1 = 1$, $l_2 = 3$, $l_3 = 3$ and $l_4 = 2$. The average length per symbol is 1.45 bits, yielding an encoded string which averages 72½% of the length of the source string, where we presume 2 bits per source symbol of S, i.e. $a_1 = 00$, $a_2 = 01$, $a_3 = 10$ and $a_4 = 11$. The theoretical best compression is (1.317272) or 65.86% for source S.

Consider arithmetic coding, with one fractional bit for the length, i.e. where $q = 1$. The problem now is to discover a set of lengths $l_1, l_2, l_3$ and $l_4$ which are rationals with one binary fractional bit (i.e. $l_k \times 2^{-1}$ is an integer), which minimize the average length, subject to the Kraft inequality. In this case, one can start with the Huffman lengths, and can also calculate the "ideal" lengths of $(+\log_2(1/p_i)) = 0.62149$, 3.77370, 5.32193 and 2 respectively. These "ideal" lengths give entropy performance. Exhaustive variations about these values leads to lengths $l_1 = 0.5$, $l_2 = 4$, $l_3 = 4.5$ and $l_4 = 2.5$, the Kraft inequality test yields 0.990578, which is less than 1. For source S, these lengths give an average length of 1.3625, or a compression of 68.125%, which is better than single symbol Huffman coding of 72.5% compression. To improve over this, Huffman code requires a blocking of two symbols at a time to increase the source code alphabet to 16 elements. In so doing, the compression achieved is 66.76%.

In devising the values for $A_k$ for lengths 0.5, 4, 4.5 and 2.5; consider the "ideal" probabilities $p_k' = 2^{-l_k}$ which would give rise to the above lengths: $p_1' = 0.7071$, $p_2' = 0.0625$, $p_3' = 0.04419$ and $p_4' = 0.17678$.

For fraction $x=0$, the $A_k(0)$ values represent the approximation, to $q$ fractional bits, of the "ideal" cumulative probabilities $p_{k-1}'$. At least 5 fractional bits are suggested, as smallest $p_3'$ in binary is 0.0000101101.

| | | |
|---|---|---|
| $A'_1(0) = p'_0 = 0.0$ | = | 0.00...0 |
| $A'_2(0) = p'_1 = 0.7071067+$ | = | 0.10110101000+ |
| $A'_3(0) = P'_2 = 0.7696067+$ | = | 0.11000101000+ |
| $A'_4(0) = P'_3 = 0.8138009+$ | = | 0.11010000010+ |

The task at hand is to approximate $A_k'(0)$ to $r(2)$ integer and $r-1$ fraction bits such that the decodability criteria are satisfied. Assume Max $C_o < 2^0$ and max $C_{0.5} < 2^{0.5}$ are satisfied. Rounding to $(r-1) = 5$ fractional bits,

| First Try (x = 0) | $A_{k+1} - A_k$ | $x'$ | $(2^{x'}) \cdot 2^{-l_k - x' + x}$ |
|---|---|---|---|
| $A_1(0) = 0.0$ | .71875 | .5 | .7071067812 |
| $A_2(0) = (0.10111)_2 = .71875$ | .0625 | 0 | .0625 |
| $A_3(0) = (0.11001)_2 = .78125$ | .0625 | .5 | .044194174 |
| $A_4(0) = (0.11011)_2 = .84375$ | | .5 | .1767766953 |

Assuming max $C_o = 1$ and max $C_{0.5} = 1.1414$, then $$A_{k+1}(0) - A_k(0) > \text{Max } C_x \cdot 2^{l_{k+x'}}$$

for $k = 1, 2$ and 3.

However, $A_{4(0)} + 2^{-l_4} = 1.020526695 > 1$. This can be corrected by going to $(r-1) = 6$ fractional bits, and subtracting $2^{-6}$ from $A_2(0)$, $A_3(0)$ and $A_4(0)$ for the first try.

| Second Try (x = 0) | $A_{k+1} - A_k$ | $(2^{x'}) \cdot (2^{-l_k - x' + x})$ |
|---|---|---|
| $A_1(0) = 0.0$ | .703125 | .7071067812 |
| $A_2(0) = (0.101101)_2 = .703125$ | .0625 | .0625 |
| $A_3(0) = (0.110001)_2 = .765625$ | .0625 | .044194174 |
| $A_4(0) = (0.110101)_2 = .828125$ | | .1767766953 |

In this case, $A_4(0) - A_3(0) = 0.0625$ which is greater than $2^{-l_3} = 0.044194174$ by more than $2^{-6}$, so $A_4$ can be made less by $2^{-6}$:

| Third Try (x = 0) | $A_{k+1} - A_k$ | $(2^{x'}) \cdot 2^{-l_k - x' + x}$ |
|---|---|---|
| $A_1(0) = 0$ | .703125 | .7071067812 |
| $A_2(0) = (0.101101)_2 = .703125$ | .0625 | .0625 |
| $A_3(0) = (0.110001)_2 = .765625$ | .046875 | .044194174 |
| $A_4(0) = (0.110100)_2 = .8125$ | | .1767766953 |

Now we note $0.8125 + 2^{-l_4} = 0.9892766953 < 2^0$. However, there is a problem with $A_2(0) - A_1(0) < 2^{l_1}$. But if max $C_{0.5}$ is small enough, the decodability criteria may still be satisfied based on the actual values of max $C_o < 2^0$ and max $C_{0.5} < 2^{0.5}$.

As with the x=0 case, begin with the "ideal" augend amounts $A_k'(0.5) = 2^{0.5} p_{k-1}$:
$A_1'(0.5) = 0.0 = 0$
$A_2'(0.5) = 1 = (1.0000000)_2$
$A_3'(0.5) = 1.088388348 = 1.00010110+$
$A_4'(0.5) = 1.150888348 = 1.00100110+$ First try (x=0.5): Round up the "ideal" values

| $A_k$ | $A_{k+1} - A_k$ | $x'$ | $(2^{x'}) \cdot 2^{-l_k - x' + .5}$ |
|---|---|---|---|
| $A_1(.5) = 0.000000 = 0$ | 1 | 0 | 1 |
| $A_2(.5) = 1.000000 = 1$ | 0.09375 | .5 | 0.08838834765 |
| $A_3(.5) = 1.000110 = 1.09375$ | 0.0625 | 0 | 0.0625 |
| $A_4(.5) = 1.001010 = 1.15625$ | | 0 | 0.25 |

For the test on $A_4(0.5)$, $A_4(0.5) + 2^{0.5 - l_4} = 1.40625 < 2^{0.5} = 1.41421$, and it is satisfied with the knowledge of $A_4(0)$ and $A_4(0.5)$; (Max $C_o$) and (max $C_{0.5}$) can be determined by encoding a string of symbols $a_4$. C is initialized to zero; and $C_o$ is bounded above by $2^0$, $C_{0.5}$ is bounded above by $2^{0.5}$; these monotonically increasing sequences converge to max $C_o$ and max $C_{0.5}$ respectively. Max $C_o$ has been determined to be 0.9879032758, which in binary is 0.111111001110011100111...00111... Max $C_{0.5}$ is 1.403225806 which in binary is 1.011001110011100111...00111... with this new value of max $C_{0.5}$; $[A_2(0) - A_1(0)] = 0.703125$ is tested against (max $C_{0.5}$) $\cdot 2^{-l_1 - 0.5} = (1.403225806) \cdot (0.5) = 0.701612903$; and is seen to satisfy the decodability criteria.

Had this last attempt failed to meet the decodability criteria, then the strategy would be to increase the number of fractional bits $(r-1)$ to more closely approximate the "ideal" augends $A'_k(x)$. As long as $\Sigma 2^{-l_k} < 1$, a solution for $q > 0$ (i.e. noninteger (fractional) lengths $l_k$) always exists.

To continue the example, the encoder and decoder memories must be loaded. Encoder memory 57 contains:

| address (k) | value ($l_k$) |
|---|---|
| 00 | $(000.1)_2$ |
| 01 | $(100.0)_2$ |
| 10 | $(100.1)_2$ |
| 11 | $(010.1)_2$ |

Memory 59 contains:

| Address (x,k) | Value ($A_k(x)$) |
|---|---|
| 0,00 | $(0.000000)_2$ |
| 0,01 | $(0.101101)_2$ |
| 0,10 | $(0.110001)_2$ |
| 0,11 | $(0.110100)_2$ |
| 1,00 | $(0.000000)_2$ |
| 1,01 | $(1.000000)_2$ |
| 1,10 | $(1.000110)_2$ |
| 1,11 | $(1.001010)_2$ |

For the decoder, memories 109 and 117 are the same as memories 59 and 57 respectively of the encoder. Memory 99 is as follows:

| Address X, Cx | Encoding for k | Symbol |
|---|---|---|
| 0,0.000000 | 00 | $a_1$ |
| ↓ | ↓ | |
| 0,0.101100 | 00 | |
| 0,0.101101 | 01 | $a_2$ |
| ↓ | ↓ | |
| 0,0.110000 | 01 | |
| 0,0.110001 | 10 | $a_3$ |
| ↓ | ↓ | |
| 0,0.110011 | 10 | |
| 0,0.110100 | 11 | $a_4$ |
| ↓ | ↓ | |
| 0,1.111111 | 11 | |
| 1,0.000000 | 00 | $a_1$ |
| ↓ | ↓ | |
| 1,0.111111 | 00 | |
| 1,1.000000 | 01 | $a_2$ |
| ↓ | ↓ | |
| 1,1.000101 | 01 | |
| 1,1.000110 | 10 | $a_3$ |

-continued

| Address X, Cx | Encoding for k | Symbol |
|---|---|---|
| ↓ | ↓ | |
| 1,1.001001 | 10 | |
| 1,1.001010 | 11 | $a_4$ |
| ↓ | ↓ | |
| 1,1.111111 | 11 | |

This memory implements a simultaneous comparison of the value of $C_x$ (retained fraction $x$) against the $A_k(x)$.

EXAMPLE: Encoing a symbol string

Suppose now the string $a_4a_2a_1a_3$ is to be encoded. Let C denote the C-register $C(i)$ the entire encoded string including C at the ith step to be encoded. The stops are as follows:

```
Clock (1)  a₄ →   l₄ = 2.5, x = .5, C⁽¹⁾ = A₄(.5) = (1.001010)₂
Clock (2)  a)     a₂→l₂ = 4; Y = 4, X = 0.5; A₂(.5) = 1.000000)₂
           b)     C⁽¹⁾ is shifted right 4 places and added
                  to A₂(.5):
                  C⁽²⁾ = 1.0001001010. The lowest order 4⁻
                  bits go to the buffer/controller, C = 1.000100.
Clock (3)  a)     a₁l₁ = 0.5; Y = 1, X = 0 and A₁(0) = 0
           b)     C is shifted right 1 place with the lowest
                  bit going to the buffer/controller and
                  added to A₁(0):
                  C⁽³⁾ = 0.10001001010; C = 0.100010.
Clock (4)  a)     a₃→l₃ = 4.5, Y = 4, X = .5; A₃(.5) = 1.000110
           b)     C⁽³⁾ is shifted right 4 places (0.000010₃
                  with a 0-bit to buffer/controller and
                  added to A₁(0):
                  C⁽⁴⁾ = 1.001000001001010; C = 1.001000.
```

Consider now the task of the decoder, given string $C = 1.001000001001010$ and retained fraction $X = 0.5$. The decoder is initialized to register $x = 0$ and the 7-bit C register is given 1.001000.

```
Clock (1)  a)  Address X,C (1,1.001000) to memory 99
               extracts k(10) = a₃.
           b)  l₃ = 4.5; new X will be 0, Y = 1ₖ + new X −
               present X = 4,
           c)  A₃(.5) = 1.000110 is subtracted from
               1.001000 = 0.000010;
           d)  this is shifted left 4 places, filled
               with the next 4 bits from the buffer
               controller (0010) to be stored in C:
               0.100010. (C in buffer = 01010)
Clock (2)  a)  Address X,C(0,0.100010) to memory 99
               extracts K(00) = a₁.
           b)  l₁ = 0.5, so new X = 0 and Y = 0.5 + 0.5 = 1
           c)  A₁(.5) = 0.000000 is subtracted from
               C = 0.100010
           d)  this is shifted left 1 place, with 1 bit (0)
               supplied from buffer; C = 1.000100; C in
               buffer = 1010.
Clock (3)  a)  Address X,C(1,1.000100) to memory 99
               extracts k(01) = a₂.
           b)  l₂ = 4; so new X = .5, Y = 4.5 − .5 = 4.0
           c)  A₂(.5) = 1.000000 is subtracted from
               C = 1.000100, yielding 0.000100
           d)  this is shifted left 4 places, with 4
               bits (1010) supplied from the buffer
               controller, C = 1.001010; buffer/controller
               empty.
Clock (4)      [buffer controller empty, signalling "last
               step"].
           a)  Address X,C(1.001010) to memory 99
               extracts k(11) = a₄.
           b)  l₄ = 2.5, so new X = 0; Y = 2.
           c)  A₄(.5) = 1.001010 is subtracted from
               C = 1.001010 to yield 0.000000.
           d)  the buffer-controller ignores the shift
               amount. Decoding is complete.
```

As a check, the C-register is left all 0's and the X register is also at its initial value of 0. Were this not the case, then an error must have occurred.

It is to be understood that the particular embodiment of the invention described above and shown in the drawings is merely illustrative and not restrictive on the broad invention, that various changes in design, structure and arrangement may be made without departure from the spirit of the broader aspects of the invention as defined in the appended claims.

We claim:

1. An apparatus for arithmetically encoding successive symbols in a symbol string from a finite source alphabet, said apparatus comprising:

means including means responsive to each symbol for deriving a length indication therefrom and means for adding said length indication to a prior length attribute for recursively calculating a new length attribute for each string segment of arithmetically encoded data, each such new length attribute consisting of an integer y and fractional part;

means for generating an $r$ digit value $A_k$ indicative of each particular new length attribute and the cumulative probability occurrence of an arbitrary ordering of the symbols;

means for recursively computing the new string segment of arithmetically encoded data by adding the $r$ digit value $A_k$ to a predetermined number $r$ of digits of the prior string segment; and means responsive to the integer part of the new length attribute for shifting out of the apparatus $y$ of the least significant digits of the prior string segment of encoded data.

2. An apparatus according to claim 1, wherein the finite source alphabet includes symbols having at least semi-stationary relative frequency of occurrence, the arbitrary ordering of symbols is based upon a decreasing relative frequency of occurrence.

3. An apparatus according to claim 1, wherein the predetermined number $r$ of digits are the $r$ most significant digits and the only portion of the prior spring of encoded data functioning as an arithmetic operand.

4. An arithmetic string encoder comprising:

means including means responsive to each successive symbol from a source of symbols from a finite alphabet for generating a length attribute for a string of encoded data, the means generating the length attribute recursively from the sum of the length attribute of a previous string and a q digit rational approximation of the instant symbol; and means jointly responsive to each successive symbol and the generated length attribute for forming a new string, said joint means forming the new string recursively from the sum of the last string and the product of the cumulative probability of occurrence of an arbitrary ordering of all symbols arranged down to but not inclusive of the symbol being encoded and the integer two raised to a power equal to the generated length attribute, said joint means including means for shifting out of the encoder the least significant number of digits of the last string, which number is the greatest integer equal to or less than the integer portion of the generated length attribute.

5. An apparatus for arithmetically decoding the string $C(sa_k)$ in order to extract symbol $a_k$ which symbol was encoded by apparatus according to claim 4, wherein said decoding apparatus comprises:

means responsive to $C(sa_k)$ and $x(sa_k)$ for ascertaining the largest index $k$ of the arbitrary ordering of symbols whose value $A_k$ is less than the $r$ most significant digits of $C(sa_k)$, $0 \leq C(sa_k) < 2$, $0 \leq A_k < 2$, and $r \geq \log(1/p_m)$; $p_m$ being the probability least frequently occurring symbol in the source alphabet.

6. An apparatus for arithmetically encoding successive terms in a symbol string $s=a_i a_j \ldots$ from a source alphabet of N symbols, the apparatus being of the type in which each new term $a_k$ gives rise to a new code string $C(sa_k)$ and a new code string length attribute $L(sa_k)$, where $1 \leq k \leq N$, the apparatus comprising:

means (57, 61-77) including a table of concordance between symbols $a_k$ and their length indicators $l(a_k)$, where $$\sum_{k=1}^{N} 2^{-l(a_k)} < 1,$$

said means being responsive to each symbol $a_k$ for obtaining $l(a_k)$ from the table and for generating the length attribute, said attribute being inclusive of integer $y$ and $x$ values and being generated according to the recursion:

$L(sa_k)=L(s)+l(a_k)=$ integer $y(sa_K)=$ fraction $x(sa_k)$; and means (59, 79-89) jointly responsive to each symbol $a_k$ and the new length indicator $L(sa_k)$ for generating the new code string $C(sa_k)$ according to the recursion:

$$2^{-y(sa_k)} \cdot C(sa_k) = 2^{-y(sa_k)} \cdot C(s) + P_{k-1} 2^{x(sa_k)}$$

where $P_{k-1} = \Sigma p(a_i)$, $P_o=0$, $[p_n=1]$ $P_N=1$, $P_{k-1}$ being the cumulative probability of occurrence of an arbitrary ordering of the symbols; said jointly responsive means including means (77-85) for shifting out of the encoder $y(sa_k)$ of least significant digits of $C(s)$.

7. An apparatus for encoding successive terms in a symbol string $s=a_i a_j \ldots$ from a source alphabet of N symbols, the apparatus being of a type in which each new term $a_k$ gives rise to a new code string $C(sa_k)$ and a new code string length indicator $L(sa_k)$, comprising:

first means (57, 61-77) including a table of concordance between the symbols $a_k$ and their length indicators $l(a_k)$, $\Sigma 2^{-l(a_k)} < 1$, said means being responsive to each symbol $a_k$ for obtaining $l(a_k)$ from the table and for generating an integer $y(sa_k)$ and fractional $x(sa_k)$ portion of $L(sa_k)$ according to the recursion:

$L(sa_k)=L(s)+l(a_k)=$ integer $y(sa_k)+$ fraction $x(sa_k)$ second means (59) jointly responsive to $a_k$ and $x(sa_k)$ for producing an intermediate $r$ digit value $A_k=P_{k-1} 2^{x(sa_k)}$, where:

$P_{k-1} \approx \Sigma 2^{-l(a_i)}$, $P_o=0$, $P_N=1$, $P_{k-1}$ being the cumulative probability of occurrence for an arbitrary ordering of the symbols; and third means (79-89) for generating $2^{-y(sa_k)} \cdot C(sa_k)$ according to the recursion:

$$2^{-y(sa_k)} \cdot C(sa_k) = 2^{-y(sa_k)} \cdot C(s) + A_k,$$

said second and third means including means (77-85) for shifting out of the apparatus $y(sa_k)$ of the least significant digits of $C(s)$.

8. An apparatus according to claim 7, wherein the length indicator $L(sa_k)$ is determined by the recursion:

$L(sa_k)=x(s)+l(a_k)$.

9. An apparatus according to claim 7, wherein $A_k$ lies within the range:

$[P_{k-1} 2^{x(sa_k)} - 2^{-(r-h)}] \leq A_k \leq [P_{k-1} 2^{x(sa_k)} + 2^{-(r-h)}]$.

10. An apparatus according to claim 7, wherein $r \geq \log 1/p_m$, $p_m$ being the probability of the least frequently occurring symbol.

11. An apparatus according to claim 7, wherein the length indicator $l(a_k)$ is a q digit rational number approximation as rounded off to the inverse log of the probability of occurrence of $a_k$.

12. An apparatus for arithmetically decoding a code string $C(sa_k)$ utilizing a calculated length attribute $L(sa_k)$ thereof in order to extract symbol $a_k$, comprising means (21,91,115,123) for receiving $r$ digits of $C(sa_k)$ and for receiving $t$ digits of the integer value $y(sa_k)$ of the length attribute of the new code word;

first means (93,95,97,99,105) accessed by the higher order $r$ digits of $C(sa_k)$ and $q$ digits of $x(sa_k)$ for generating position number $k$ of an arbitrary order of source alphabet symbols;

second means (105,107,109) responsive to position number $k$ and $x(sa_k)$ for generating corresponding value $$A_k = P_{k-1} 2^{x(sa_k)}, \quad P_{k-1} \approx \sum_{i=1}^{k-1} 2^{-l(a_i)}, \quad P_O = 0, P_N = 1,$$

where $P_{k-1}$ is the cumulative probability of occurrence of the arbitrary order of source alphabet symbols;

third means (93,111,113) for determining the difference between $C(sa_k)$ and $A_k$, forming thereby the $r$ digit quantity $2^{-y(sa_k)} \cdot C(s)$;

fourth means (101,103,117-129) also responsive to position number $k$ and $x(sa_k)$ for generating the integer value $y(sa_k)$ according to the recursion:

$l(a_k)+x(s)=y(sa_k)+x(sa_k)$;

fifth means (91) for shifting $2^{-y(sa_k)} \cdot C(s)$ to the right by $y(sa_k)$ digit positions and for causing the receiving means to input the next $y(sa_k)$ higher order digits of $C(s)$ thereby completing the recursion or the $r$ highest ordered digits of the encoded string;

sixth means (123,105,129) for applying $y(sa_k)$ to the fifth means, $x(sa_k)$ to the first and second means, and $x(s)$ to the fourth means;

seventh means (Xlator, 25) converting the position number $k$ into the symbol $a_k$.

13. An apparatus according to claim 12, wherein the decoded values of $C(sa_k)=0$ and $x(sa_k)=0$ are indicative of the end of the coded string.

* * * * *